United States Patent

Chooi et al.

[11] Patent Number: 6,024,208
[45] Date of Patent: Feb. 15, 2000

[54] FEEDER FOR SUPPLYING ELECTRICAL COMPONENTS TO A PICK UP LOCATION

[75] Inventors: Kon Hing Chooi; Ka Teik Lim; Ping Chow Teoh, all of Penang, Malaysia

[73] Assignee: Motorola, Inc., Schaumburg, Ill.

[21] Appl. No.: 08/933,191

[22] Filed: Sep. 18, 1997

[51] Int. Cl.[7] .............................. B65G 47/19; B65G 51/20
[52] U.S. Cl. ................ 198/534; 406/85; 406/83
[58] Field of Search .................... 198/525, 534; 193/32, 40; 406/83, 85, 191

[56] References Cited

U.S. PATENT DOCUMENTS

| | | | |
|---|---|---|---|
| 4,088,213 | 5/1978 | Nakamura et al. | 193/40 |
| 4,191,286 | 3/1980 | Sato et al. | 193/40 |
| 4,340,323 | 7/1982 | Bankes et al. | 193/32 |
| 4,770,565 | 9/1988 | Upton | 406/85 |

*Primary Examiner*—William E. Terrell
*Assistant Examiner*—Mark Deuble
*Attorney, Agent, or Firm*—Dale W. Dorinski

[57] ABSTRACT

A feeder (1) for supplying magnetically attractable electrical components (20) to a pick-and-place machine. The feeder (1) comprises a hopper (2) for storing the components (20) and a pick up location (3) for supplying the components to the pick-and-place machine. A passage (4) provides communication between the hopper (2) and pick up location (3). An air jet outlet (6) in passage (4) provides for propelling the components (20) and one or more magnets (35) are located adjacent an intermediate portion of the passage (4) and provide a magnetic field to assist in reducing the velocity of said components (20) passing through the intermediate portion.

8 Claims, 3 Drawing Sheets

FEEDER FOR SUPPLYING ELECTRICAL COMPONENTS TO A PICK UP LOCATION

FIELD OF THE INVENTION

This invention relates to a feeder for supplying electrical components to a pick up location. The invention is particularly useful for, but not necessarily limited to, supplying surface mountable electrical components, stored in hoppers, to pick up locations for subsequent mounting to a circuit board or other substrate.

BACKGROUND OF THE INVENTION

Component feeding is a well-known process in Surface Mounting Technology (SMT). In general, a feeder is used to sequentially supply surface mountable electrical components to a pick up location for subsequent placing, by a pick-and-place machine, onto a Printed Circuit Board (PCB) which is pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pick up location therefore leaving a pocket containing one of the electrical components in a position accessible by the pick-and-place machine. Unfortunately, the tape is substantially wider than the components located in the pockets, in addition, the reel and apparatus for removing the film also adds to the width and overall size of the feeder.

Hopper feeders also known as bulk or tube feeders are an alternative to tape and reel feeders. Hopper feeders comprise a hopper in communication by means of a passage with the pick up location which supplies components stored in the hopper to the pick up location by pulsed air blasting techniques. The pick up location has an abutment wall and an aperture and in use the abutment wall abuts the components supplied from the hopper before they are removed, through the aperture, by the pick-and-place machine.

One problem with hopper feeders is that the components may be propelled along the passage at relatively high velocities due to the pulsed air blasting techniques used. As a result, the propelled components collide with stationary components in the passage that have been previously propelled by pulsed air blasting. The impact of these collisions may result in some of the components being damaged or cracked and debris may also be deposited which can lead to components jamming in the passage.

BRIEF DESCRIPTION OF THE DRAWINGS

In order that the invention may be readily understood and put into practical effect, reference will now be made to a preferred embodiment illustrated in the accompanying drawings in which.

DETAILED DESCRIPTION OF A PREFERRED EMBODIMENT OF THE INVENTION

Figure 1:
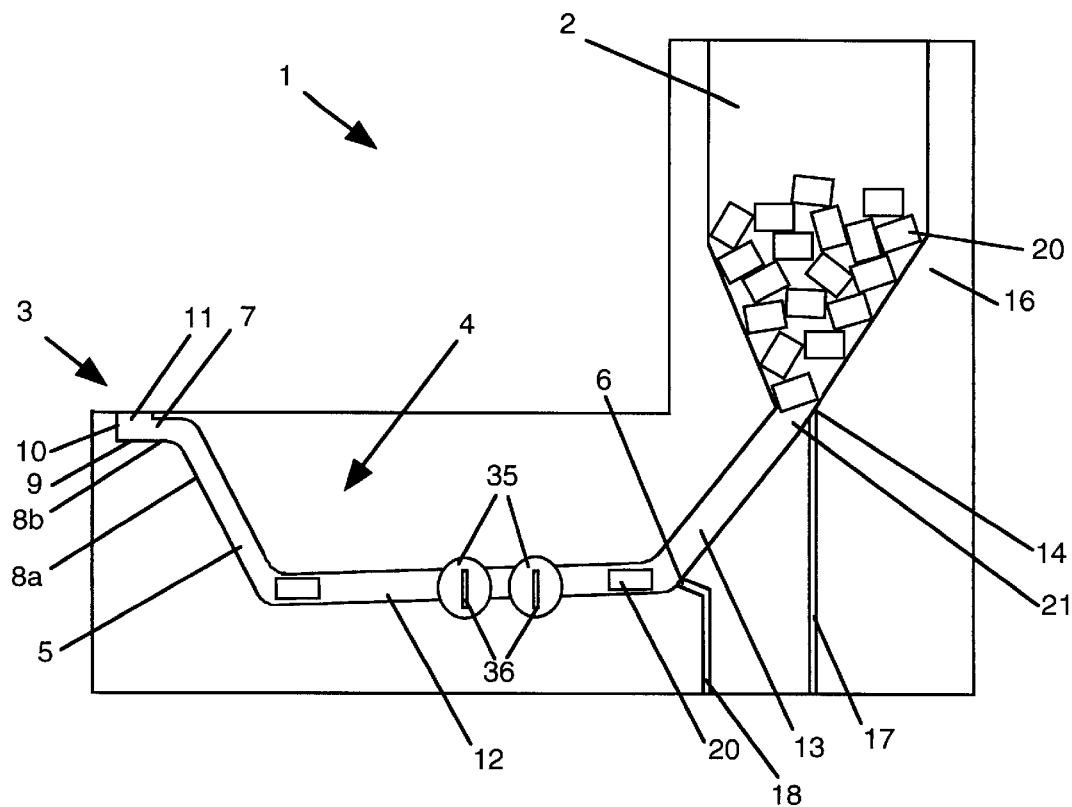
FIG. 1 is a side view of a preferred embodiment of a feeder in accordance with this invention.
Figure 2:
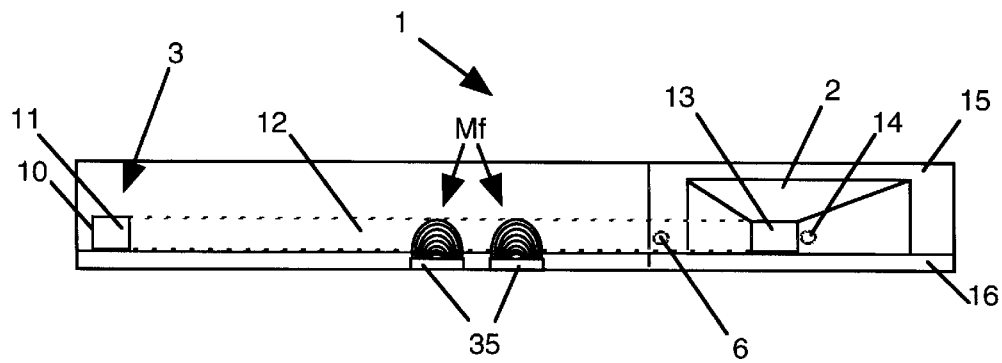
FIG. 2 is a plan view of the feeder of FIG. 1.
Figure 3:
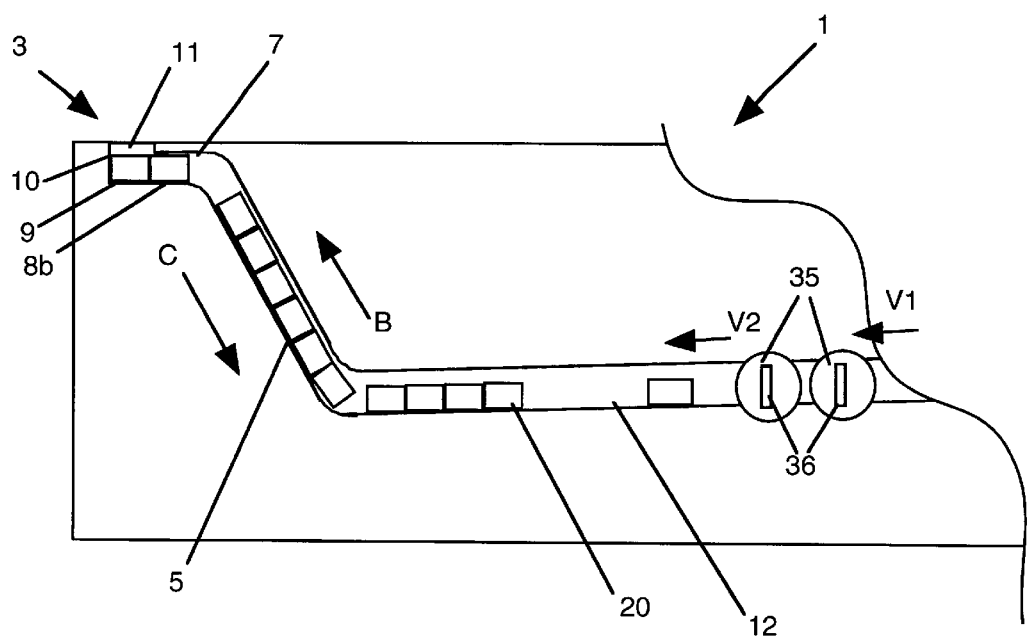
FIG. 3 illustrates the feeder of FIG. 1 in operation.
Figure 4:
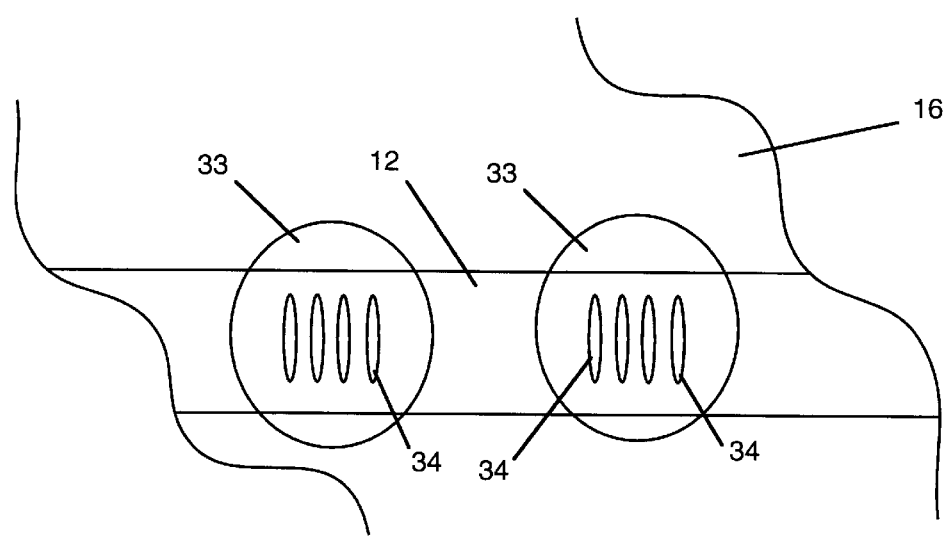
FIG. 4 is a side view of part of the feeder of FIG. 1 when showing complementary recesses in a housing of the feeder for engaging with magnets.

Referring to FIGS. 1 to 4 there is illustrated a feeder 1 for supplying magnetically attractable electrical components to pick-and-place machine. The feeder 1 comprises a storage device in the form of a hopper 2, a pick up location 3 and a passage in the form of a channel 4. The channel 4 provides communication between the hopper 2 and the pick up location 3 so that magnetically attractable electrical components 20 in hopper 2 can be transferred to the pick up location 3.

In this embodiment, the channel 4 comprises an upwardly inclined portion 5 that is upwardly inclined towards the pick up location 3. The channel 4 also has a first portion 12 and second portion 13 angled relative to each other. The second portion 13 is coupled at one end to an outlet 21 of the hopper 2 and at the other end to an end of the second portion 12. The other end of the second portion 12 is coupled to an end of the upwardly inclined portion 5 and the first portion 12 is angled relative to the upwardly inclined portion 5.

The channel 4 has an buffer portion 7 between the pick up location 3 and the upwardly inclined portion 5. The buffer portion 7 has a component supporting surface 8b in a horizontal plane. Accordingly, the supporting surface is angled relative to a component supporting surface 8a of the upwardly inclined portion 5.

The pick up location 3 has a component supporting surface 9 that is aligned with surface 8b. There is also an abutment wall 10 for stopping and positioning the components 20 and access aperture 11 for allowing removal of the components 20, by a pick-and-place machine (not shown), from pick up location 3.

There is an agitator in the form of an air jet outlet 14 located in hopper 2, adjacent the outlet 21, for agitating components 20 in hopper 2 for allowing some of the components 20 to pass through outlet 21 and into channel 4. A propulsion system including an air jet outlet 6 coupled to a compressor, provides for air blasts to propel components 20 up the upwardly inclined portion 5 towards the pick up location 3. Further, air conduits 17,18 allows for sequenced pulsed air blasts to be supplied to respective outlets 14,6. In this regard, it should be noted that air blasts from outlet 14 may also assist and comprise part of the propulsion means for propelling the components 20 along channel 4 and up the upwardly inclined portion 5.

The channel 4, pick up location 3, hopper 2, air conduits 17, 18 and respective outlets 14,6 are machined into a surface of a block 15 and enclosed by a transparent plate 16 that is glued and bolted to the block 15 (bolts not shown). In this regard, both block 15 and plate 16 form a housing that is non-magnetically attractable. Further, the feeder system 1 also includes two recesses 33 formed in the transparent plate 16 adjacent an intermediate portion of channel 4. The recesses 33 include slotted debris removal apertures 34 each providing an access passage to the channel 4. Removably mounted to plate 16 in respective recesses are permanent magnets 35 which provide a magnetic field Mf in the intermediate portion of channel 4. The magnets are flush fitting with plate 15 and include a slot for assisting in their removal from respective recesses 33.

In use, the conduits 17, 18 are operatively coupled to a controlled pulsed compressed air supply. The air supply provides a blast of air through outlet 14 that agitates the components 20 in hopper 2. Accordingly, after each air blast through outlet 14 one or more components 20 may drop through the outlet 21 into the second portion 13. Air blasts through outlet 6 provide the primary means for propelling the components 20 at a velocity V1 along a portion of the channel 4. As the magnetically attractable components 20 pass through the magnetic field Mf in the intermediate portion of the channel 4, their velocity V1 is reduced, for example, to a velocity V2. Accordingly, the reduced velocity V2 results in a reduced impact when propelled components 20 collide with a queue of stationary components in the channel 4 that have been previously propelled along channel 4 by pulsed air blasts from outlet 6. The slotted debris removal apertures 34 providing a passage to the channel 4 assist in removing magnetically attractable debris from the track 4. For instance, as the components 20 pass by the slotted debris removal apertures 34, magnetically attractable lose debris is attracted towards the magnets 35 and thus this debris can pass through the apertures 34 and be deposited onto one the associated magnet 35. When the magnet 35 is removed from recess 33, during maintenance, the debris can be discarded.

If there is available space in the upwardly inclined portion 5, a subsequent air blast through outlet 6 will push the components 20 in the portions 12 or 13 up the upwardly inclined portion 5 (in the direction of arrow B). In this regard, impact of adjacent components 20 in the queue of is minimized as they usually abut each other or Further, if there is available space, a leading one of the components 20 in the queue will be pushed into the buffer portion 7. However, if there is no available space in the buffer portion 7, upon completion of an air blast the components 20 will slide down the inclined portion 5 in the direction of arrow C due to the effects of gravity.

When there is no component 20 located in pick up location 3, the next air blast will push the leading one of the components into location 3. This leading component will abut wall 10 and be positioned underneath the access aperture 11 ready for removal by a pick-and-place machine. Further, if there is a component 20 located in the buffer portion 7, this will push against, and assist in, maintaining abutment of the leading component against the wall 10.

Figure 5:
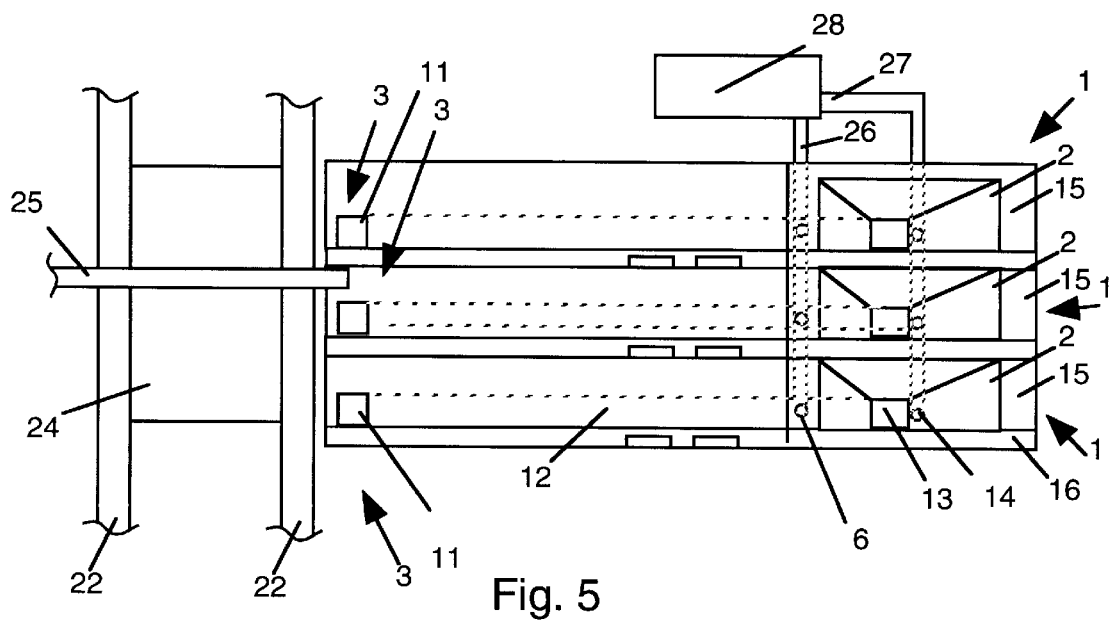
FIG. 5 is a plan view of a plurality of feeders of FIG. 1 when mounted adjacent a conveyor track of a pick-and-place machine.

Referring to FIG. 5 there is illustrated a plan view of a plurality of feeders 1 mounted adjacent a conveyor track 22 of a pick-and-place machine. The conveyor track 22 is used to transport a printed circuit board 24 to a position near the pick up locations 3 so that a robot arm 25 can remove the components in the locations 3 via the access apertures 11. The robot arm 25 then places the components onto the board 24 in their required positions. The flush fitting of magnets 35 with plate 16 allows for space savings and assists in reducing the overall width of each feeder 1, thereby providing for a relatively high density of pick up locations 3 to be mounted adjacent track 22.

As illustrated, there are flexible conduits 26, 27 respectively coupling each of conduits 18,17 to a controlled pulsed pressurized air supply 28. The flexible conduits 26,27 are connected to respective outlets of conduits 18,17 located on an underside surface of each feeder 1 that also reduces the overall width of the feeders 1.

The present invention advantageously limits the amount impact of colliding components in channel 4. Consequently, damage to components 20 is reduced and this can also reduce the amount of debris deposited in the channel.

Although this invention has been described with reference to a preferred embodiment, it is to be understood that the invention is not limited to the specific embodiment described herein. For example, the magnets need not be mounted adjacent the first portion, they may be mounted adjacent any portion that is intermediate the ends of channel 4. However, preferably the magnets may be mounted at or near to a medial portion of the channel, however, for differing lengths and shapes of channels the actual location (s) for the magnets may vary. Further, in another form, there may be no need for an upwardly inclined portion (5) of channel 4.

We claim as our invention:

1. A feeder for supplying magnetically attractable electrical components to a pick-and-place machine, the feeder comprising:

at least one storage device for storing some of said components;

a pick up location for supplying said components to said pick-and-place machine;

a passage providing communication between said storage device and said pick up location;

a propulsion device associated with said passage, said propulsion device propelling said components at a velocity along at least a portion of said passage; and one or more magnets removably mounted to a housing of said feeder adjacent an intermediate portion of said passage, said magnets providing a magnetic field in said passage to thereby assist in reducing said velocity of said components passing through said intermediate portion.

2. A feeder as claimed in claim 1, wherein said magnet is a permanent magnet.

3. A feeder as claimed in claim 2, wherein said magnet is mounted by complementarily engaging a recess in said housing.

4. A feeder as claimed in claim 3, wherein said recess is formed in a non magnetically attractable material.

5. A feeder as claimed in claim 4, wherein the housing associated with said intermediate portion is formed from a non magnetically attractable material.

6. A feeder as claimed in claim 5, wherein said magnet is located adjacent to one side of said passage.

7. A feeder as claimed in claim 1, wherein said storage device is a hopper having an associated agitator device.

8. A feeder for supplying magnetically attractable electrical components to a pick-and-place machine, the feeder comprising:

at least one storage device for storing some of said components;

a pick up location for supplying said components to said pick-and-place machine;

a passage providing communication between said storage device and said pick up location;

a propulsion device associated with said passage, said propulsion device propelling said components at a velocity along at least a portion of said passage; and a recess in a housing of said feeder adjacent an intermediate portion of said passage, said recess having one or more apertures for providing access to remove debris from said passage;

one or more magnets mounted in said recess, said magnets providing a magnetic field in said passage to thereby assist in reducing said velocity of said components passing through said intermediate portion.

* * * * *